United States Patent [19]

Hsu

[11] Patent Number: 5,585,299

[45] Date of Patent: Dec. 17, 1996

[54] PROCESS FOR FABRICATING A SEMICONDUCTOR ELECTROSTATIC DISCHARGE (ESD) PROTECTIVE DEVICE

[75] Inventor: Chen-Chung Hsu, Taichung, Taiwan

[73] Assignee: United Microelectronics Corporation, Hsinchu, Taiwan

[21] Appl. No.: 617,600

[22] Filed: Mar. 19, 1996

[51] Int. Cl.[6] ............................................. H01L 21/8238
[52] U.S. Cl. .................. 437/56; 437/34; 437/58; 437/200
[58] Field of Search .................... 437/56, 57, 44, 437/58, 34, 41 RCM, 200; 257/355, 357

[56] References Cited

U.S. PATENT DOCUMENTS

| | | | |
|---|---|---|---|
| 4,345,366 | 8/1982 | Brower | 437/34 |
| 4,528,744 | 7/1985 | Shibata | 437/34 |
| 4,753,898 | 6/1988 | Parrillo et al. | 437/56 |
| 4,891,326 | 1/1990 | Koyanagi | 437/57 |
| 5,023,190 | 6/1991 | Lee et al. | 437/44 |
| 5,141,890 | 8/1992 | Haken | 437/34 |
| 5,166,087 | 11/1992 | Kakimoto et al. | 437/56 |
| 5,246,872 | 9/1993 | Mortensen | 437/56 |
| 5,399,513 | 3/1995 | Liou et al. | 437/200 |
| 5,516,717 | 5/1996 | Hsu | 437/56 |

*Primary Examiner*—T. N. Quach
*Assistant Examiner*—Michael Trinh
*Attorney, Agent, or Firm*—Cushman Darby & Cushman IP Group of Pillsbury Madison and Sutro LLP

[57] ABSTRACT

Disclosed is a process for fabricating a semiconductor device having both a functional region and an electrostatic discharge (ESD) protective region formed on the same substrate. A gate oxide layer is formed on both the functional region and the ESD protective region and a polysilicon layer is formed on the gate oxide layer. A mask is used to etch the polysilicon layer and the gate oxide layer to form gate electrode and also expose part of the silicon substrate. Ions are implanted to form a lightly doped source/drain electrode. An ESD mask is used to selectively remove part of the oxide layer on the functional region, thus forming an isolator on lateral sides of the gate electrode in the functional region. Ions are then implanted to form a heavily doped region and lightly doped source/drain electrode. After that, a metallization layer is formed by sputtering deposition and then rapid thermal annealing and etching are performed to form self-aligning $TiSi_2$ layer on the gate electrode and on exposed surface of the source/drain electrode. Then the ESD mask is used again to selectively remove part of the oxide layer on the ESD protective region. Finally, ions are implanted to form a heavily doped region. Using the same ESD mask to construct both the ESD protective region and the functional region provides considerable cost savings.

17 Claims, 3 Drawing Sheets

PROCESS FOR FABRICATING A SEMICONDUCTOR ELECTROSTATIC DISCHARGE (ESD) PROTECTIVE DEVICE

BACKGROUND OF THE INVENTION

1. Field of the Invention

The present invention relates in general to semiconductor fabrication. More particularly, the invention relates to a process for fabricating a protective device for protecting semiconductor devices and circuits against electrostatic discharge (ESD).

2. Description of Related Art

Electrostatic discharge (ESD) protection can be provided for semiconductor devices using a dual diffusion source/drain (DDD) field effect transistor and a lightly doped source/drain (LDD) field effect transistor. The DDD field effect transistor provides better protection than the LDD field effect transistor. To enhance the ESD protection capability of the LDD field effect transistor, additional masking and ion implanting steps are required to raise the concentration of impurities in the LDD region.

FIGS. 1A–1C (Prior Art) are sectional diagrams of a semiconductor device depicting the steps of a conventional process for fabricating an ESD protective device. In each of these diagrams, the left half part shows the structure for the semiconductor device (hereinafter referred to as "functional region") intended to be protected by the conventional ESD protective device, and the right half part shows the structure for the conventional ESD protective device (hereinafter referred to as "ESD protective region").

Referring to FIG. 1A, in the first step a silicon substrate is 10 prepared and on which a gate electrode 12 is formed. Ions are implanted to form a lightly doped source/drain region 14.

Referring to FIG. 1B (Prior Art), subsequently an isolator 16 is formed on lateral sides of the gate electrode 12. Prior to forming the ESD protective device in the wafer, the isolator 16 must be removed by using a mask. In the subsequent step, another ion implantation is carried out with a high concentration of dopants, whereby the functional region is formed with an LDD structure and the ESD protective region is formed into a structure as shown in the right part of FIG. 1C (Prior Art). In this structure, the heavily doped region 18 in the source/drain electrode includes the originally formed lightly doped region 14, so that a better ESD protective effect is provided.

It is a drawback of the conventional process that, in order to provide the ESD protective region with high ESD capability and retain the LDD structure in the functional region, an additional mask must be used to remove the isolator 16 in the ESD protective region while retaining the isolator in the functional region. Moreover, in the step of forming metal silicide in the functional region by using self-aligning silicide process, another mask must be used to etch the metal silicide or to retard its growth.

Since the ESD is below 2000 V both for the LDD structure and the self-aligning silicide, the process is not suitable for use to form the ESD protective device. However, since the functional region must have such a structure, the use of two masks, one in the ESD protective region for etching the isolator and the other in the self-aligning silicide process for etching the metal silicide used for pattern definition, is quite costly for the overall fabrication process of the semiconductor device.

SUMMARY OF THE INVENTION

It is therefore a primary objective of the present invention to provide a process for fabricating an ESD protective device on a semiconductor device, by which only one mask is needed to form both the ESD protective region and the functional region of the semiconductor device.

In accordance with the foregoing and other objectives of the present invention, there is provided a new and improved method for fabricating an ESD protective device. It is an important aspect of the present invention that an ESD mask is used to form both an ESD protective region and a functional region. The functional region includes a lightly doped source/drain electrode and a self-aligning silicide structure while the ESD protective region includes no self-aligning silicide structure but retains a lightly doped source/drain structure.

A process according to the present invention comprises the steps of:

defining a functional region and an ESD protective region on the silicon substrate and forming a field oxide layer therebetween;

forming a gate oxide layer on both the functional region and the ESD protective region;

forming a polysilicon layer on the gate oxide layer;

using a mask of predefined pattern to etch the polysilicon layer and the gate oxide layer so as to form a gate electrode and expose part of the silicon substrate, ion implanting to the exposed part of the silicon substrate to form a lightly doped source/drain electrode;

forming an oxide layer on both the functional region and the ESD protective region;

coating a first photoresist layer on the oxide layer on the ESD protective region and then using an ESD mask for pattern definition so as to selectively remove part of the oxide layer on the functional region, thus forming an isolator on lateral side of the gate electrode in the functional region;

ion implanting using the gate electrode and the isolator in the functional region as a mask to form a heavily doped region to thereby form a lightly doped source/drain electrode, removing the first photoresist layer on the oxide layer in the ESD protective region;

forming by sputtering deposition a metallization layer of titanium to thereby perform a rapid thermal annealing process and an etching process to form a self-aligning $TiSi_2$ layer on the gate electrode and exposed surface of the source/drain electrode;

coating a second photoresist layer on the functional region and then using the ESD mask to selectively remove part of the oxide layer on the ESD protective region;

ion implanting using the electrode gate in the ESD protective region as mask to form heavily doped region, and removing the second photoresist layer on the functional region.

Another process provided by the present invention for fabricating an electrostatic discharge (ESD) protective device on a silicon substrate, comprises the steps of:

defining a functional region and an ESD protective region on the silicon substrate and forming a field oxide layer therebetween;

forming a gate electrode on the silicon substrate and exposing surfaces of the silicon substrate where the functional region and a source/drain electrode in the silicon substrate are to be formed, then performing an ion implantation process to the exposed surfaces so as to form a lightly doped region;

forming an oxide layer on both the functional region and the ESD protective region;

coating a first photoresist layer on the oxide layer on the ESD protective region and then using an ESD mask for pattern definition so as to form a lightly doped source/drain electrode on the functional region, then removing the first photoresist layer on the oxide layer in the ESD protective region;

performing a self-aligning silicide process to apply a layer of metal on the lightly doped source/drain electrode in the functional region so as to form self-aligning metal silicide layers respectively on the gate electrode and the exposed surfaces of the drain/source electrode;

coating a second photoresist layer on the functional region and then using the ESD mask to selectively remove part of the oxide layer on the ESD protective region; and ion implanting using the electrode gate in the ESD protective region as mask to form heavily doped region, then removing the second photoresist layer on the functional region.

BRIEF DESCRIPTION OF DRAWINGS

The present invention can be more fully understood by reading the subsequent detailed description of the preferred embodiments thereof with references made to the accompanying drawings, wherein.

DETAILED DESCRIPTION OF PREFERRED EMBODIMENT

FIGS. 2A–2E, are sectional views of a semiconductor device showing various stages of a fabrication process according to the present invention for fabricating an ESD protective device. In each of these diagrams, the left half part shows the structure for the semiconductor device (hereinafter referred to as "functional region") intended to be protected by the ESD protective device according to the present invention, and the right half part shows the structure for the ESD protective device according to the present invention (hereinafter referred to as "ESD protective region").

Figure 1A:
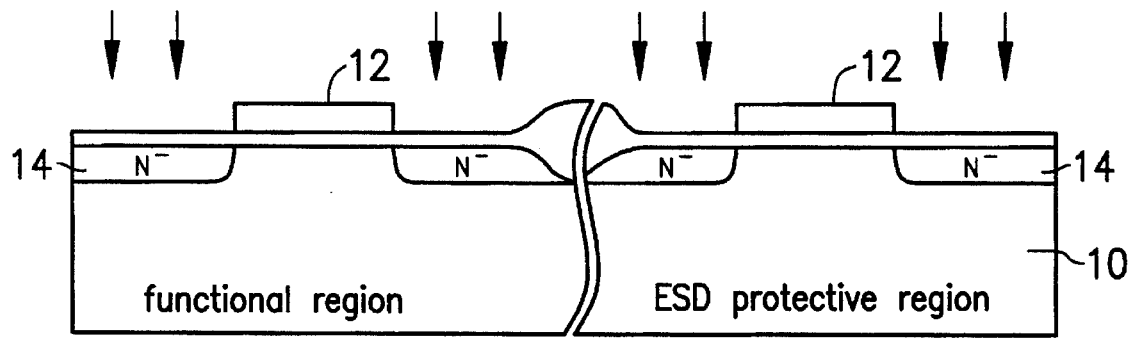
FIGS. 1A–1C (Prior Art) are sectional views showing the steps involved in a conventional process for fabricating an ESD protective device.
Figure 1B:
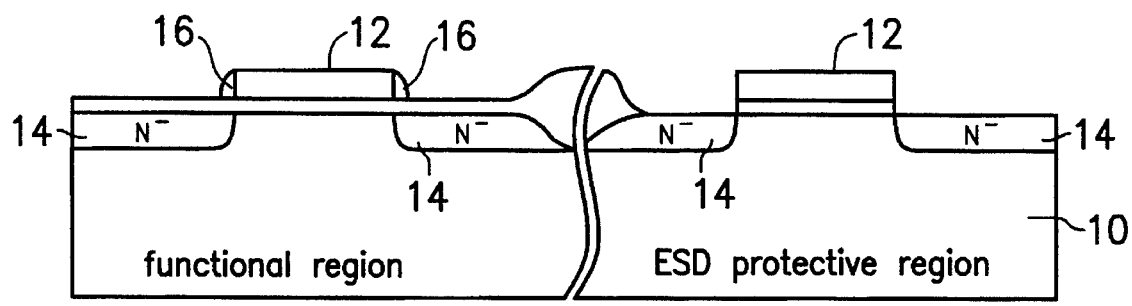
Figure 1C:
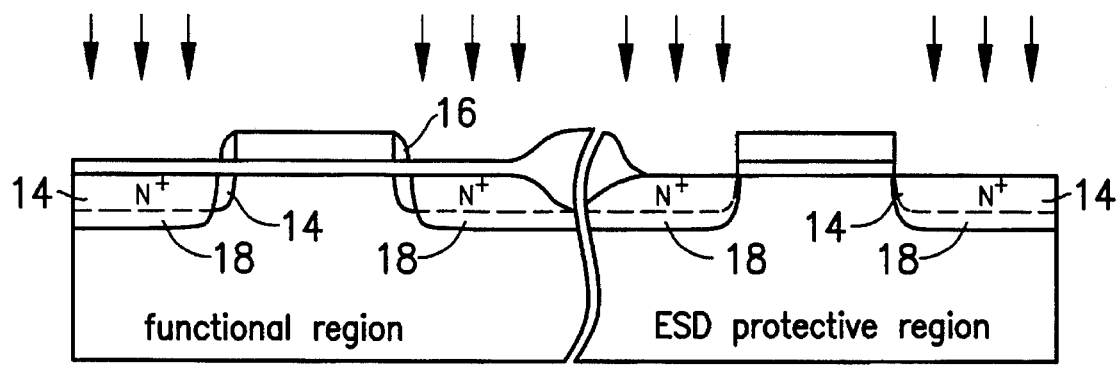
Figure 2A:
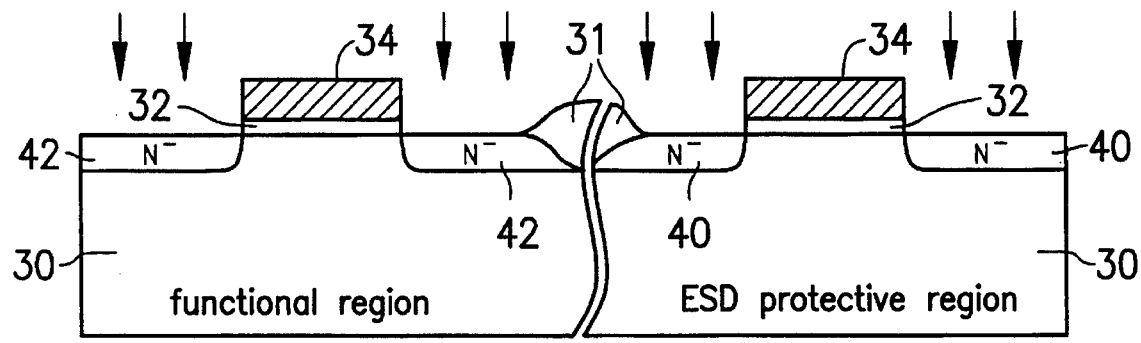
FIGS. 2A–2E are schematic sectional diagrams depicting the steps of a process according to the present invention for fabricating an ESD protective device.

Referring to FIG. 2A, a silicon substrate 30 is prepared and on which a gate electrode 34 is formed. Ions are then implanted to form lightly doped source/drain regions 40, 42.

On the silicon substrate 30, field oxide 31 is used separate the functional region from the ESD protective region. Next, oxidation is performed to form gate oxide layer 32 on the silicon substrate 30. Subsequently, a first polysilicon layer 34 with a thickness of between 800 Å to 1500 Å is deposited on the gate oxide layer 32. A mask is then used to define photoresist pattern to etch the first polysilicon layer 34 and the gate oxide layer 32 so as to expose part of the silicon substrate where the source/drain regions 40, 42 in the functional region and the ESD protective region are located. After the photoresist is removed, the structure is as that shown in FIG. 2A, in which the first polysilicon layer 34 that serves as gate electrode has a length of 1.2–1.5 μm.

Subsequently, ions are implanted using a source of first type impurities such as N-type phosphor ions with an energy of 50 KeV and a concentration of $3 \times 10^{13}$ atoms/cm$^2$, whereby lightly doped source/drain regions 40, 42 are formed.

Figure 2B:
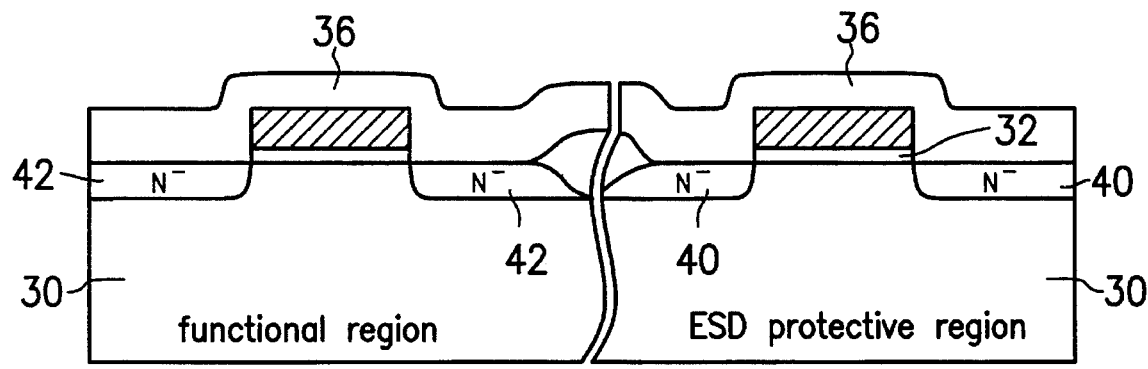

Referring to FIG. 2B, in the next step an oxidation process is performed, in which the low-pressure chemical-vapor deposition (LPCVD) method is used to deposit a layer of silicon dioxide 36 to a thickness of 1000–3000 Å.

Figure 2C:
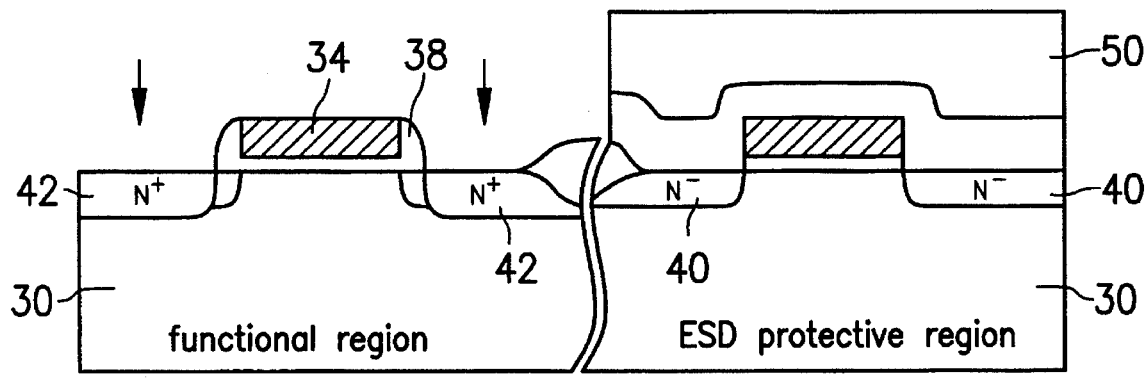
Figure 2D:
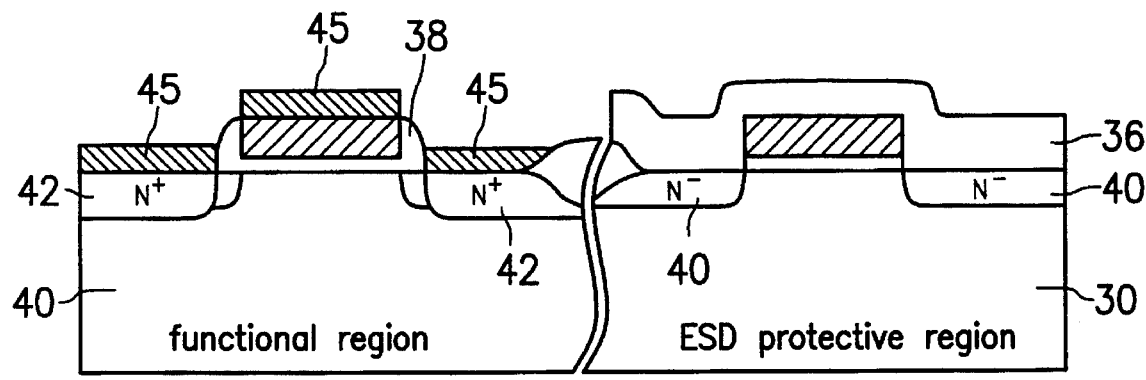

Referring next to FIGS. 2C and 2D, there are shown steps to construct the functional region. As shown in FIG. 2C, a first photoresist layer 50 is coated on the oxide layer 36 in the ESD protective region. Next, a mask for pattern definition on the ESD protective region is used and etching is performed to remove the oxide layer 36 in the functional region. An isolator 38, which can be silicon dioxide, is formed on the lateral side of the gate electrode in the functional region. N-type ions such as arsenic ions are implanted with an energy of 50–100 KeV and a concentration of $1 \times 10^{15}$ to $1 \times 10^{16}$ atoms/cm$^2$, whereby a heavily doped N$^+$-type region is formed. This allows the functional region to be formed with a lightly doped drain (LDD) structure.

Referring to FIG. 2D, subsequently a self-aligning silicide process is carried out in which sputtering deposition is used to deposit a layer of metal as titanium, cobalt, or platinum. In preferred embodiment, a layer of titanium is deposited on the functional region to a thickness of 300 Å to 800 Å. Next, a rapid thermal annealing process is performed at a temperature of 600° C. to 700° C. In this process, N$_2$ or NH$_3$ is used so as to allow the partly deposited titanium film to react with the silicon on the source/drain electrode and the polysilicon on the gate electrode, thereby forming a layer of TiSi$_2$ 45. The remaining titanium which was not involved in the reaction and other remnants can be selectively removed by wet etching using, for instance, a solvent containing NH$_4$OH/H$_2$O$_2$/H$_2$O with a ratio 1:1:5–10. Finally, the rapid thermal annealing process is performed again at a temperature of 800° C. to 900° C. The self-aligning silicide structure is thus formed.

Figure 2E:
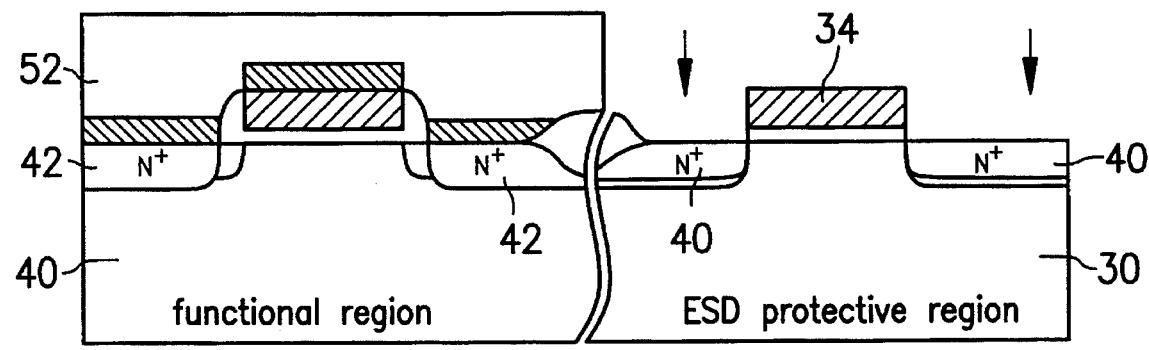

Referring to FIG. 2E, there is shown the step to construct the ESD protective region. A second photoresist layer 52 is coated on the functional region for ESD pattern definition of the ESD protective region. Then the oxide layer (silicon dioxide) 36 is removed by etching. N-type ions such as arsenic ions are implanted with an energy of 50 KeV to 100 KeV and a concentration of $1 \times 10^{15}$ to $1 \times 10^{16}$ atoms/cm$^2$, into the ESD protective region. The photoresist layer 52 is then removed by using suitable solvents.

Since in the steps shown in FIG. 2C to FIG. 2E, the same ESD photoresist layer is used, the first photoresist layer 50 and the second photoresist layer 52 are made complementary in optical characteristics, i.e., one is positive photoresist and the other negative photoresist.

It is an important aspect of the present invention that the functional region is formed with the LDD and self-aligning silicide structure and the ESD protective device according to the present invention is formed as the ESD protective region in the right part of the semiconductor device shown in FIG. 2E. Moreover, the heavily doped N$^+$-type region 42 in the source/drain electrode includes the originally formed lightly doped N$^-$-type region. As a result, the ESD protective effect is much more improved. The semiconductor device made with the protective device according to the present invention shown in FIG. 2E has the conventional heavily doped N$^+$-type region 42 so as to enhance the ESD capability. Since the protective device according to the present invention (the aforementioned ESD protective region) is included along with the functional structure (the aforementioned functional region) in the semiconductor device intended to be protected by the protective device according to the present invention, only one mask is needed in the fabriess. Thus, fabrication cost is significantly reduced.

The present invention has been described hitherto with exemplary preferred embodiments directed to the utilization of N-type source/drain electrode. However, it is to be understood that the scope of the present invention need not be limited to the disclosed preferred embodiments. Materials, conductive characteristics, parameters, and conditions set for the processes are all subject to other modifications and still within the spirit and scope of the present invention. Therefore, the claims are intended to cover various modifications and similar arrangements. The scope of the claims should be accorded the broadest interpretation so as to encompass all such modifications and similar arrangements.

What is claimed is:

1. A process for fabricating an electrostatic discharge (ESD) protective device on a silicon substrate, comprising the steps of:

(1) defining a functional region and an ESD protective region on the silicon substrate and forming a field oxide layer therebetween;

(2) forming a gate oxide layer on both the functional region and the ESD protective region;

(3) forming a polysilicon layer on the gate oxide layer;

(4) forming, using a mask of predefined pattern to etch the polysilicon layer and the gate oxide layer, a gate electrode and exposing part of the silicon substrate, then performing an ion implantation process to the exposed part of the silicon substrate to form a lightly doped source/drain electrode;

(5) forming an oxide layer on both the functional region and the ESD protective region;

(6) coating a first photoresist layer on the oxide layer on the ESD protective region and then using an ESD mask for pattern definition so as to selectively remove part of the oxide layer on the functional region, thus forming an isolator on lateral side of the gate electrode in the functional region;

(7) ion implanting using the gate electrode and the isolator in the functional region as a mask to form a heavily doped region to thereby form a lightly doped source/drain electrode, then removing the first photoresist layer on the oxide layer in the ESD protective region;

(8) forming by sputtering deposition a metallization layer of titanium to thereby perform a rapid thermal annealing process and an etching process to form a self-aligning $TiSi_2$ layer on the gate electrode and exposed surface of the source/drain electrode;

(9) coating a second photoresist layer on the functional region and then using the ESD mask to selectively remove part of the oxide layer on the ESD protective region; and

(10) ion implanting using the gate electrode in the ESD protective region as mask to form heavily doped region, then removing the second photoresist layer on the functional region.

2. A process as claimed in claim 1, wherein in Step (3) the polysilicon layer on the gate dioxide layer has a thickness of between 800 Å to 1500 Å.

3. A process as claimed in claim 1, wherein in Step (4) the polysilicon layer serving as gate electrode has a length of 1.2 μm to 1.5 μm.

4. A process as claimed in claim 1, wherein in Step (4) the ion implantation process uses a source of N-type phosphor ions with an energy of about 50 KeV and a concentration of about $3 \times 10^{13}$ atoms/cm$^2$.

5. A process as claimed in claim 1, wherein in Step (5) the oxide layer is formed through a low-pressure chemical-vapor deposition (LPCVD) method to a thickness of 1000 Å to 3000 Å.

6. A process as claimed in claim 1, wherein in Step (7) the ion implantation process uses a source of N-type arsenic ions with an energy of 50 KeV to 100 KeV and a concentration of $1 \times 10^{15}$ to $1 \times 10^{16}$ atoms/cm$^2$.

7. A process as claimed in claim 1, wherein in Step (8) the sputtering deposition process deposits the titanium layer to a thickness of 300 Å to 800 Å.

8. A process as claimed in claim 1, wherein in Step (8) the etching process is a wet etching process using a solvent containing $NH_4OH/H_2O_2/H_2O$ with a ratio 1:1.5–10.

9. A process as claimed in claim 1, wherein in Step (9) the heavily doped region in the ESD protective region includes originally formed lightly doped region.

10. A process for fabricating an electrostatic discharge (ESD) protective device on a silicon substrate, comprising the following steps of:

(1) defining a functional region and an ESD protective region on the silicon substrate and forming a field oxide layer therebetween;

(2) forming a gate electrode on the silicon substrate and exposing surfaces of the silicon substrate where the functional region and a source/drain electrode in the silicon substrate are to be formed, then performing an ion implantation process to the exposed surfaces so as to form a lightly doped region;

(3) forming an oxide layer on both the functional region and the ESD protective region;

(4) coating a first photoresist layer on the oxide layer on the ESD protective region and then using an ESD mask for pattern definition so as to form a lightly doped source/drain electrode on the functional region, then removing the first photoresist layer on the oxide layer in the ESD protective region;

(5) performing a self-aligning silicide process to apply a layer of metal on the lightly doped source/drain electrode in the functional region so as to form self-aligning metal silicide layers respectively on the gate electrode and the exposed surfaces of the drain/source electrode;

(6) coating a second photoresist layer on the functional region and then using the ESD mask to selectively remove part of the oxide layer on the ESD protective region; and (7) ion implanting using the gate electrode in the ESD protective region as mask to form heavily doped region, then removing the second photoresist layer on the functional region.

11. A process as claimed in claim 10, wherein in Step (2) the ion implantation process uses a source of N-type phosphor ions with an energy of about 50 KeV and a concentration of $3 \times 10^{13}$ atoms/cm$^2$.

12. A process as claimed in claim 10, wherein in Step (3) the oxide layer is formed through a low-pressure chemical-vapor deposition (LPCVD) method to a thickness of 1000 Å to 3000 Å.

13. A process as claimed in claim 10, wherein in Step (5) the metal is selected from the group consisting of titanium, cobalt, and platinum.

14. A process as claimed in claim 10, wherein in Step (7) the ion implantation process uses a source of N-type arsenic ions with an energy of about 50 KeV and a concentration of $1 \times 10^{15}$ and $1 \times 10^{16}$ atoms/cm$^2$.

15. A process as claimed in claim 10, wherein the heavily doped region in the ESD protective region includes originally formed lightly doped region.

16. A process as claimed in claims 1 through 15, wherein the first photoresist layer and the second photoresist layer are complementary in optical characteristics.

17. A process as claimed in claim 16, wherein the first photoresist layer is positive photoresist and the second photoresist layer is negative.

* * * * *